(12) United States Patent
Levi (10) Patent No.: US 8,358,372 B2
(45) Date of Patent: Jan. 22, 2013

(54) DIGITAL CAMERA CURVED FLAT CABLE

(75) Inventor: Yosi Levi, Lapid (IL)

(73) Assignee: Eastman Kodak Company, Rochester, NY (US)

( * ) Notice: Subject to any disclaimer, the term of this patent is extended or adjusted under 35 U.S.C. 154(b) by 836 days.

(21) Appl. No.: 12/143,871

(22) Filed: Jun. 23, 2008

(65) Prior Publication Data

US 2009/0316008 A1     Dec. 24, 2009

(51) Int. Cl.
*H04N 5/225* (2006.01)
(52) U.S. Cl. ....................................................... 348/373
(58) Field of Classification Search ............. 348/207.99, 348/211.14, 373, 374; 361/750, 755; 174/117 R, 174/117 F, 117 FF, 140 S, 250, 254, 255, 174/258, 260
See application file for complete search history.

(56) References Cited

U.S. PATENT DOCUMENTS

| | | | | |
|---|---|---|---|---|
| 3,612,744 | A * | 10/1971 | Thomas | 174/36 |
| 4,693,527 | A * | 9/1987 | Bonenberger | 439/13 |
| 4,978,191 | A * | 12/1990 | Hasegawa et al. | 385/26 |
| 5,194,011 | A * | 3/1993 | Yeakley et al. | 439/162 |
| 5,210,378 | A * | 5/1993 | Tusques | 174/117 F |
| 5,250,758 | A * | 10/1993 | Fjelstad et al. | 174/254 |
| 5,281,765 | A * | 1/1994 | Iura et al. | 174/117 F |
| 5,384,431 | A * | 1/1995 | Tusques | 174/117 F |
| 6,309,243 | B1 * | 10/2001 | Tu et al. | 439/497 |
| 6,469,252 | B1 * | 10/2002 | Tanaka et al. | 174/117 F |
| 6,670,986 | B1 | 12/2003 | Ben Shoshan et al. | |
| 7,448,891 | B2 * | 11/2008 | Ahn | 439/165 |
| 2006/0016614 | A1 * | 1/2006 | Yokoyama et al. | 174/69 |
| 2006/0162950 | A1 * | 7/2006 | Poorman et al. | 174/117 F |

* cited by examiner

*Primary Examiner* — Aung S Moe
*Assistant Examiner* — Chriss Yoder, III
(74) *Attorney, Agent, or Firm* — Nelson Adrian Blish (57) ABSTRACT

A curved flat cable (32) for electrically connecting a cards cage (18) and a charged coupled device (CCD) (12) can be freely rotated coaxially in respect to the cards cage, and includes a curved shaped insulating film and a set of separate plated conductor strips (23, 44) disposed on the curved shaped insulating film.

5 Claims, 9 Drawing Sheets

DIGITAL CAMERA CURVED FLAT CABLE

FIELD OF THE INVENTION

The present invention relates to an electronic flat cable for connecting a fixed part and a rotating part which can be freely rotated coaxially in respect to the fixed part.

BACKGROUND OF THE INVENTION

Flat cables are commonly used for connecting between electronic boards and electronics devices, which are often comprised of more than one electronic board or part. Flat cables are used to transmit electronic signals from one electronic part to another electronic part, wherein both parts are typically installed in an electronic device.

A common example is a consumer radio where two electronic parts inside the radio are connected via a flat cable. In this example the electronic parts inside the radio are static. Another example is wherein two parts of a device are connected via a flat cable and one of the electronic parts is moveable with respect to the other electronic part. The flat cable connecting the moving part and the static part may be bent and consequently damaged due to the frequent mechanical strain applied on the cable during the movement of the moving part.

Figure 1A:
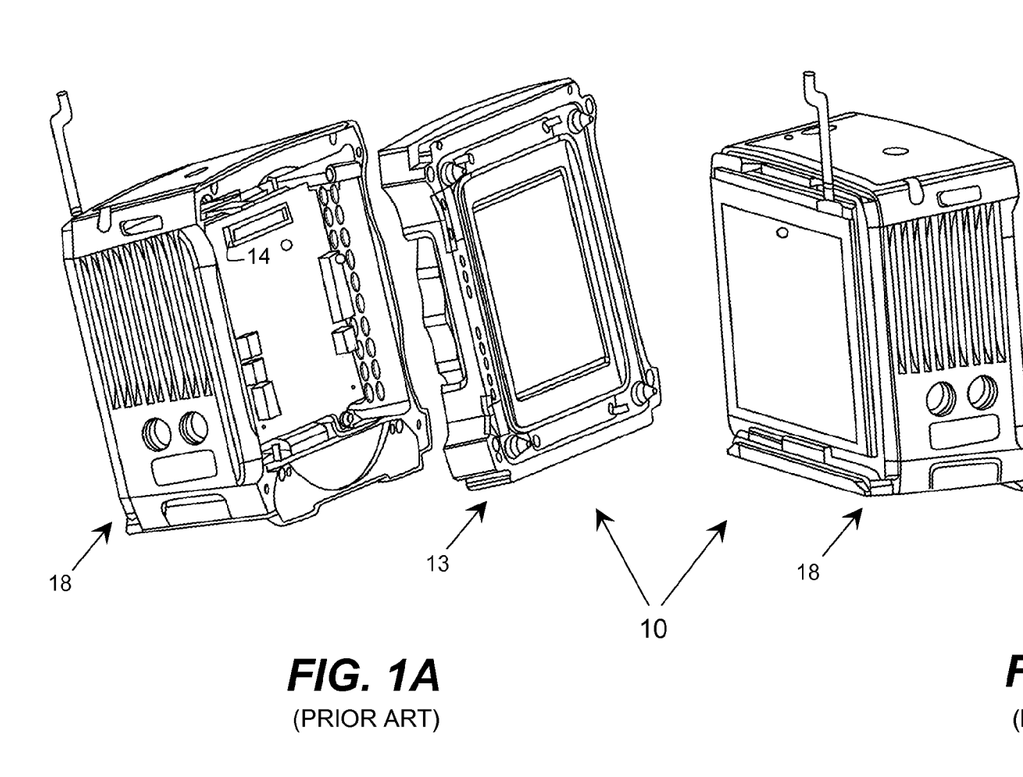
FIGS. 1A and 1B illustrate a digital camera back.
Figure 1B:
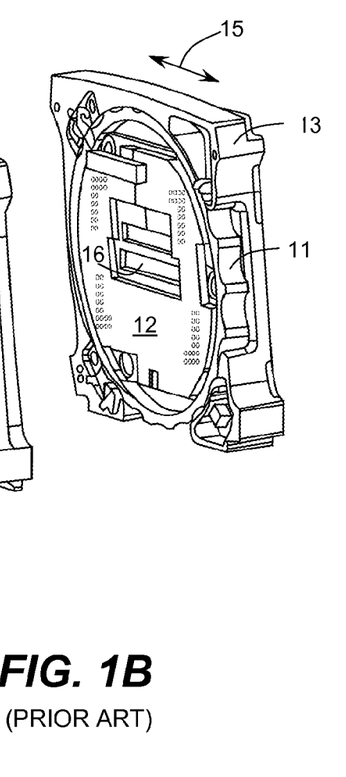

FIGS. 1A and 1B show a typical digital camera back 10 (DCB). The DCB 10 is comprised of two parts, an electronic cards cage 18 and a frame 13, which includes a charged coupled device (CCD) element 12. Cards cage 18 and CCD element 12 are electronically connected via conductor strips 23 disposed in a flat cable 22, shown in FIG. 2. Flat cable 22 is inserted into cards connector 14 (in cards cage 18) on one end, and into CCD connecter slot 16 (in CCD element 12) on the other end.

Figure 3A:
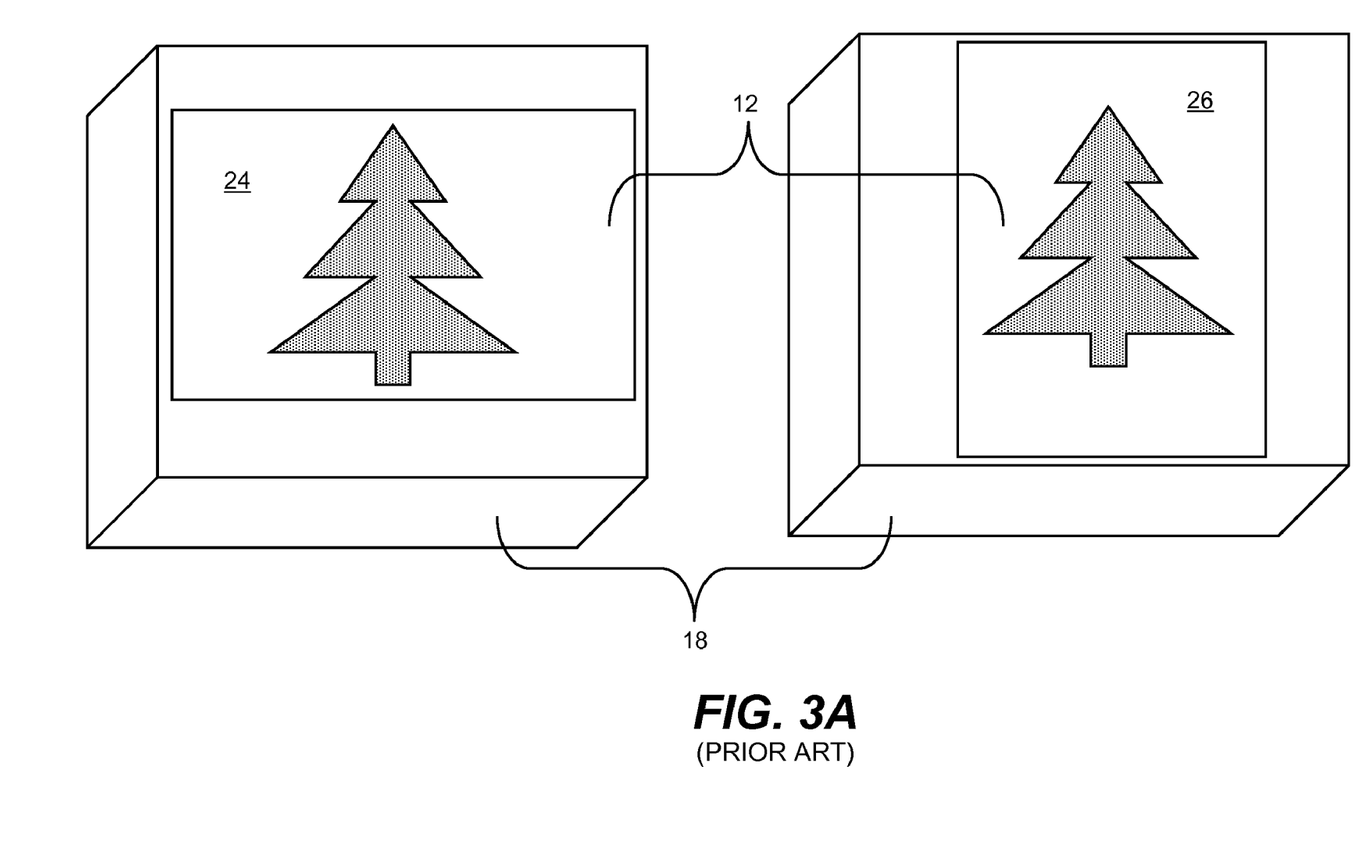
FIGS. 3A-3C illustrate a landscape and a portrait position of the digital camera back.

The CCD element 12 is movable with respect to the cards cage 18, by rotating wheel 11, in either direction, as indicated by arrow 15. The CCD element 12 is designed to be in one of two image capture positions, landscape 24 or portrait 26, as is illustrated in FIG. 3. CCD element 12 rotates 90 degrees with respect to cards cage 18 when changing positions from portrait to landscape and vice versa.

Figure 2:
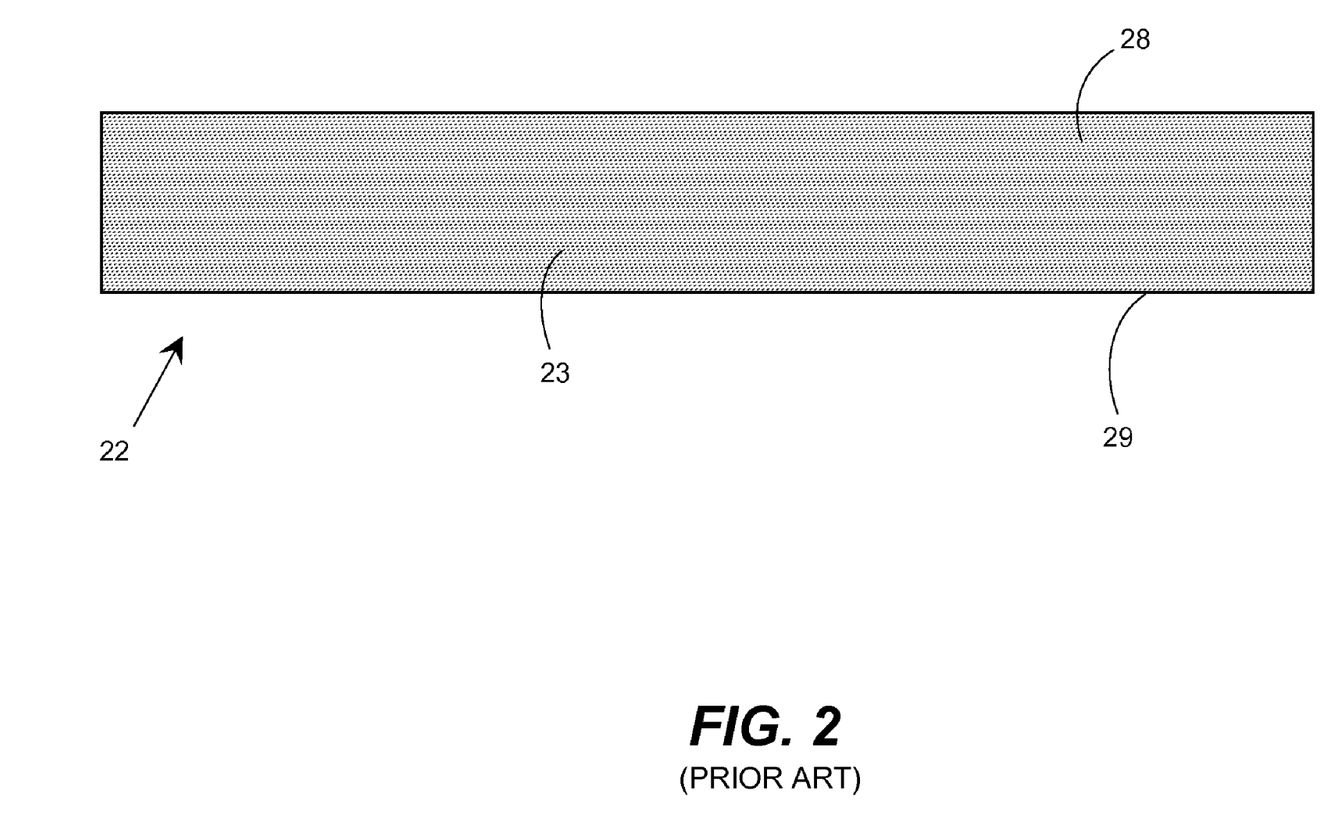
FIG. 2 illustrates a prior art flat cable.
Figure 3B:
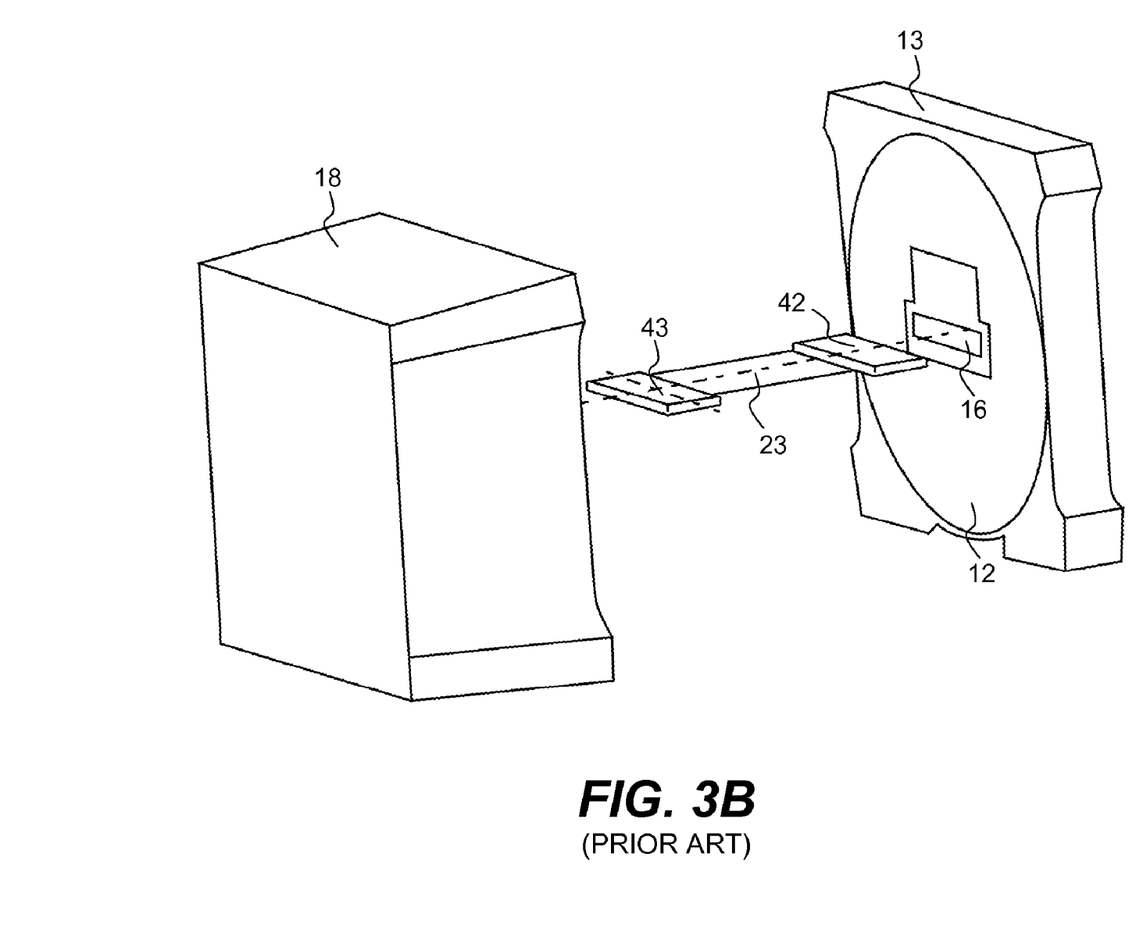
Figure 3C:
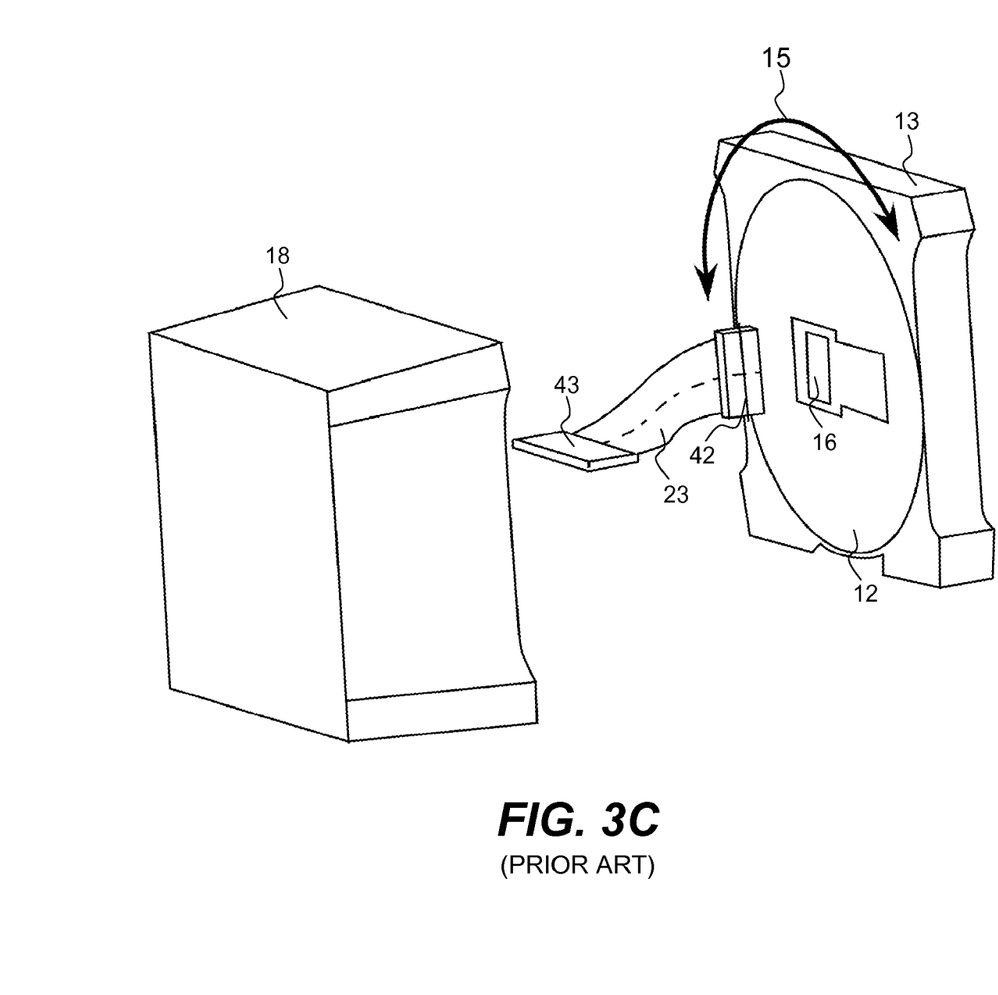

FIG. 2 shows regular flat cable 22, which connects CCD element 12 and cards cage 18. When the CCD element 12 changes position from landscape 24 to a portrait 26 position, see FIGS. 3B and 3C, the flat cable 22 bends or is deformed. The first edge 28 of the flat cable 22, shown in FIG. 2, will get mechanically strained and the second edge 29 will bend. Slot 16 changes orientation when the CCD element 12 is rotated from image landscape position 24 to image portrait position 26, as slot 16 rotates from a horizontal position in FIG. 3B to a vertical position in FIG. 3C. Connector 42, which is inserted in slot 16, causes disposed conductor stips 23 to twist.

Another problem is that flat cable 22, when rotated by 90 degrees, must be long enough to compensate for cable bending during the rotation. A long cable will require an increase in the space needed for the enclosure to house CCD element 12 and cards cage 18.

It is readily apparent the flat cable 22 has several disadvantages when it is connected to a moving part. Reliability problems are caused by the mechanical strain applied to the cable when CCD element 12 rotates, and cable rotation over time may break the cable conductor strips. A long cable requires excessive electrical power needs for the DCB 10 and increases material cost. A long cable also imposes increased space for the DCB 10, and thus enlarges the DCB 10 form factor.

SUMMARY OF THE INVENTION

Briefly, according to one aspect of the present invention, a flat cable for electrically connecting a fixed body and a rotating body, which can freely rotate coaxially with respect to the fixed body, includes a curved shaped insulating film and a set of separate plated conductor strips disposed on the curved shaped insulating film. According to another aspect of the invention, a CCD on a digital camera is rotated to capture landscape and portrait photographs.

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

Figure 4A:
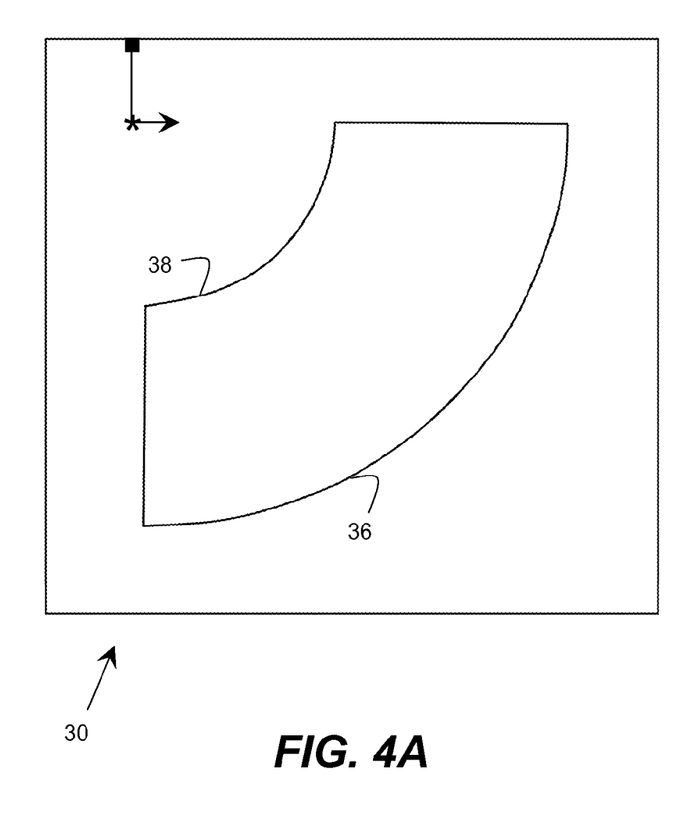
FIGS. 4A-4C illustrate a curved shaped cable with connectors.
Figure 4B:
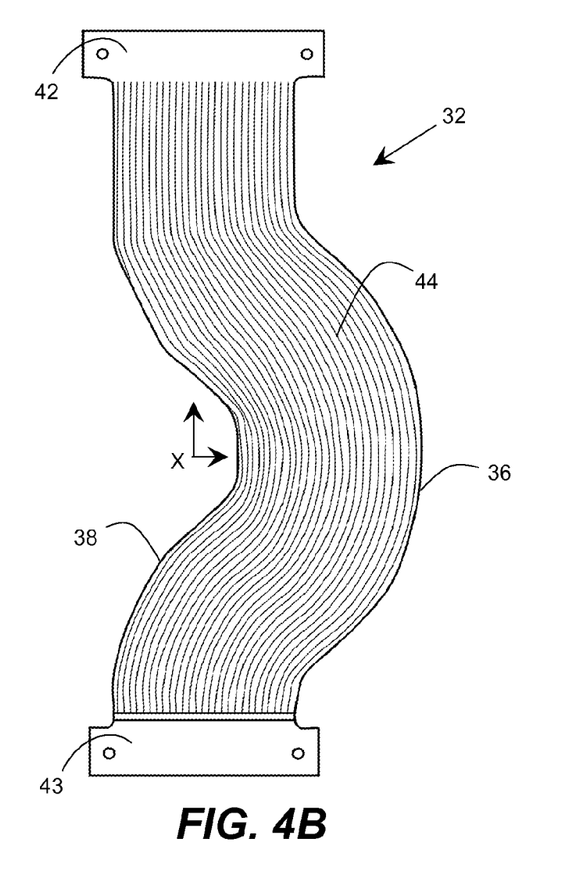
Figure 4C:
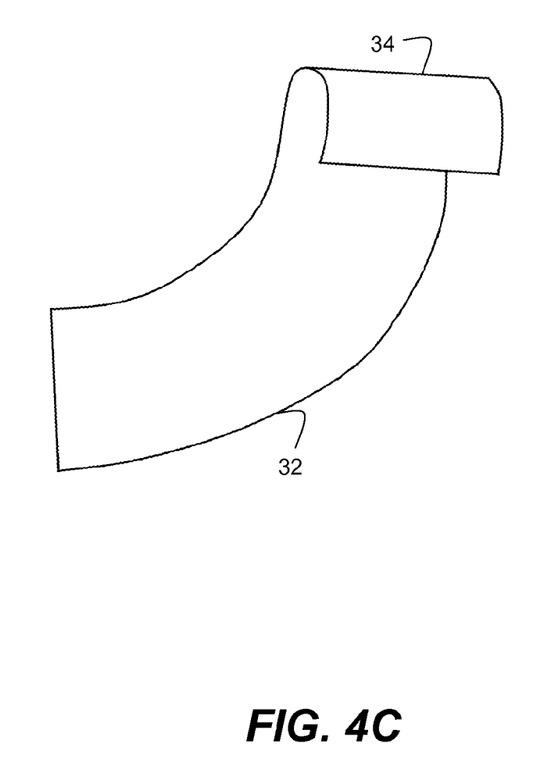

A curved shaped flat cable 32 shown in FIGS. 4A-4C overcomes deficiencies of a standard flat cable 22. The curved flat cable 32 is specifically designed for the digital camera back (DCB) 10, but can be used in similar applications where two electronic parts are connected by a cable and at least one part moves in respect to the other part.

The curved flat cable 32 is specifically designed to allow 90 degree rotation of a charged couple device (CCD) element 12 by using a relatively short, curved shaped cable. The design overcomes disadvantages created by using a regular flat cable 22 as described in the background section. Curved flat cable 32 reduces the back pulling effect of the flat cable after CCD element 12 is rotated by 90 degrees, thus diffusing mechanical forces created on curved flat cable 32.

The curved flat cable 32 was designed by imitating the radial movement of the CCD element 12 and by closely studying the path created by a regular flat cable 22 connecting between CCD element 12 and cards cage 18. The created path is a curved shaped path as is illustrated in FIG. 4A showing the natural path 30 for the cable. The circumferential length of far end part 36, see FIG. 4B, is larger than circumferential length of the near end part 38 of curved flat cable 32. FIG. 4B shows a two dimensional schematic view of curved flat cable 32 configured with connectors 42 and 43 in each end of the cable, with a curved shaped disposed conductor strips 44. FIG. 4C shows a partial three dimensional view of cable 32 when it is bended inside the DCB, wherein cable bend 34 illustrates the bent cable.

Figure 5:
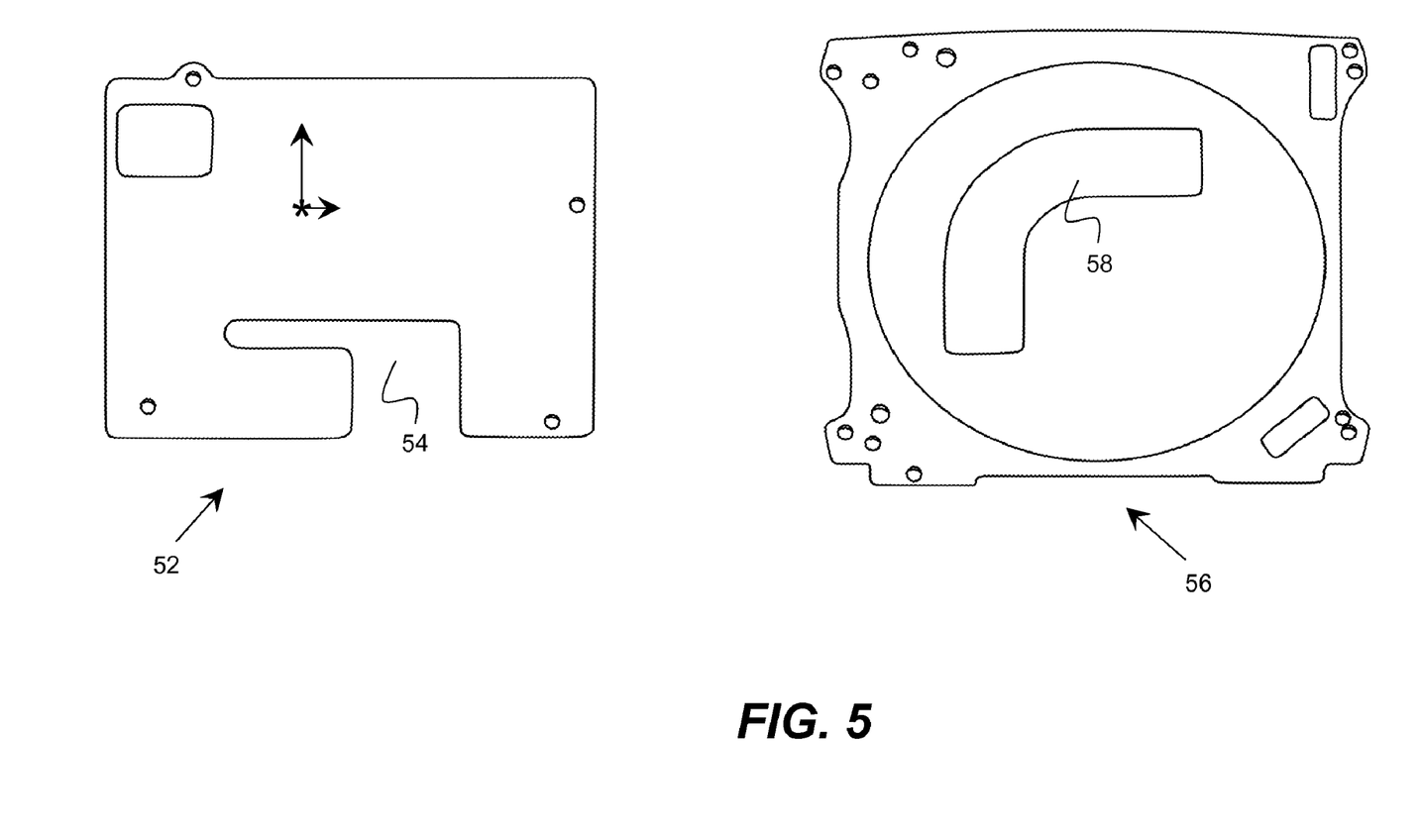
FIG. 5 illustrates a sliding surface and a separating surface for protecting the cable from being damaged.

FIG. 5 shows a sliding surface 52. The sliding surface 52 is physically attached to cards cage 18. Separating surface 56 is physically attached to frame 13, which houses CCD element 12, and rotates together with CCD element 12.

Figures 6A, 6B, 6C:
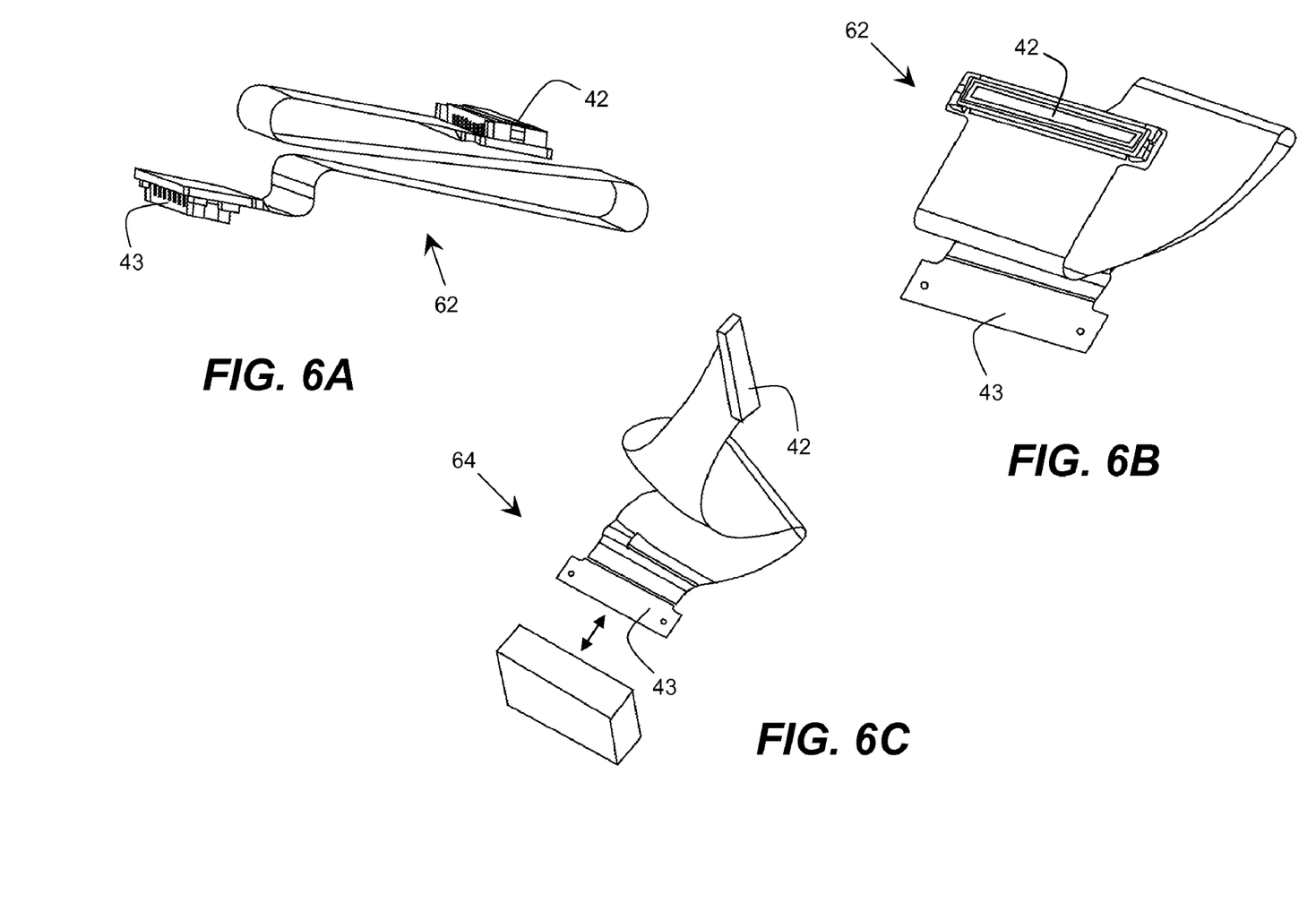
FIGS. 6A-6C illustrate a curved shaped cable in landscape and portrait position.

Curved flat cable 32 is positioned between rotating separating surface 56 and sliding surface 52. This configuration protects the curved flat cable 32 from touching electronic parts which are residing on the CCD element 12 or on the cards cage 18, thus preventing curved flat cable 32 from getting damaged. Curved flat cable 32 is inserted through cable opening 54 and connected to connector 14 in cards cage 18. The other end of curved flat cable 32 is inserted through opening 58 and connected to connector 16 in CCD element 12. Cable opening 58 is designed to conform with the rotation shape of curved flat cable 32 when CCD element 12 changes positions from portrait to landscape and vice versa. FIGS. 6A and 6B show the shape of cable 32 when the CCD element 12 is in the arc shaped flat cable landscape position 62 and FIG. 6C shows curved flat cable in the arc shaped flat cable portrait position 64.

The invention has been described in detail with particular reference to certain preferred embodiments thereof, but it will be understood that variations and modifications can be effected within the scope of the invention.

PARTS LIST 10 digital camera back (DCB)
11 wheel
12 charged coupled device (CCD)
13 frame
14 connector cards cage
15 arrow
16 slot
18 cards cage (static)
22 flat cable
23 disposed conductor strips
24 image landscape position
26 image portrait position
28 first edge of regular flat cable
29 second edge of regular flat cable
30 cable natural path created by 90 degree rotation
32 curved flat cable
34 cable bend
36 far end of curved cable
38 near end of curved cable
42 connector
43 connector
44 arc shaped disposed conductor strips
52 sliding surface
54 cable opening
56 separating surface
58 cable opening (attached to CCD element)
62 arc shaped flat cable landscape position
64 arc shaped flat cable portrait position

The invention claimed is:

1. A digital camera, improvements therein comprising:
   a camera back wherein said camera back comprises an electronic cards cage;
   a sensor wherein said sensor rotates coaxially with respect to said camera back;
   a sliding surface wherein said sliding surface is attached to said camera back;
   a separating surface wherein said separating surface is attached to a frame which includes said sensor;
   a curved flat cable for electronically connecting said camera back and said sensor wherein said curved flat cable is connected to said camera back and to said sensor through an opening on both the sliding surface and the separating surface, wherein the opening on the separating surface is shaped to conform with the curved flat cable while the sensor is rotated;
   wherein said curved flat cable comprises a curved insulating film;
   wherein the shape of said film is constructed according to the movement path of said sensor from a landscape position to a portrait position; and
   wherein a set of separate plated conductor strips are disposed on said curved insulating film and wherein said curved flat cable is adapted to slide on said sliding surface and is separated from said sensor by said separating surface.

2. The flat cable according to claim 1 wherein said plated conductor strips are disposed on said insulating film in a curved shape.

3. The flat cable according to claim 2 wherein said plated conductor strips are disposed on said insulating film parallel to each other.

4. The flat cable according to claim 1 further comprising at least one flat cable connector attached to said flat cable.

5. The flat cable according to claim 4 wherein said at least one flat cable connector is attached to at least one end of said flat cable.

* * * * *